United States Patent
Chand Sk et al.

(10) Patent No.: US 8,588,004 B2
(45) Date of Patent: Nov. 19, 2013

(54) MEMORY DEVICE HAVING MULTI-PORT MEMORY CELL WITH EXPANDABLE PORT CONFIGURATION

(75) Inventors: Md Rahim Chand Sk, Bangalore (IN); Nikhil Lad, Bangalore (IN)

(73) Assignee: LSI Corporation, San Jose, CA (US)

( * ) Notice: Subject to any disclaimer, the term of this patent is extended or adjusted under 35 U.S.C. 154(b) by 37 days.

(21) Appl. No.: 13/445,270

(22) Filed: Apr. 12, 2012

(65) Prior Publication Data

US 2013/0272076 A1   Oct. 17, 2013

(51) Int. Cl.
*G11C 7/10* (2006.01)
*G11C 8/00* (2006.01)

(52) U.S. Cl.
USPC ............................ 365/189.04; 365/230.05

(58) Field of Classification Search
USPC .................................................... 365/189.04
See application file for complete search history.

(56) References Cited

U.S. PATENT DOCUMENTS

| | | | |
|---|---|---|---|
| 4,933,905 A | 6/1990 | Ootani | |
| 5,706,226 A | 1/1998 | Chan et al. | |
| 5,726,562 A | 3/1998 | Mizuno | |
| 5,764,564 A | 6/1998 | Frake et al. | |
| 5,973,985 A | 10/1999 | Ferrant | |
| 6,091,626 A | 7/2000 | Madan | |
| 6,172,901 B1 * | 1/2001 | Portacci | 365/154 |
| 6,510,076 B1 | 1/2003 | Lapadat et al. | |
| 7,248,508 B1 * | 7/2007 | Frederick | 365/189.06 |
| 7,447,058 B2 | 11/2008 | Maki et al. | |
| 7,482,860 B2 | 1/2009 | De Haas | |
| 7,613,053 B2 | 11/2009 | van Winkelhoff et al. | |
| 7,688,668 B2 | 3/2010 | Hold | |
| RE42,145 E * | 2/2011 | Hobson | 365/154 |
| 8,009,500 B2 | 8/2011 | Nii et al. | |
| 2007/0109878 A1 | 5/2007 | Gouin et al. | |
| 2009/0262594 A1 | 10/2009 | Bhatia | |

OTHER PUBLICATIONS

U.S. Appl. No. 13/031,798 filed in the name V. Rachamadugu et al. on Feb. 22, 2011 and entitled "Memory Device Having Memory Cells with Write Assist Functionality."

U.S. Appl. No. 12/974,441 filed in the name V. Rachamadugu et al. on Dec. 21, 2010 and entitled "Memory Device Having Memory Cells with Enhanced Low Voltage Write Capability."

U.S. Appl. No. 12/958,402 filed in the name M.R.C. Seikh et al. on Dec. 2, 2010 and entitled "Write Assist Static Random Access Memory Cell."

* cited by examiner

*Primary Examiner* — Son Mai
(74) *Attorney, Agent, or Firm* — Ryan, Mason & Lewis, LLP

(57) ABSTRACT

A memory device includes a memory array comprising a plurality of memory cells. At least one of the memory cells comprises a pair of cross-coupled inverters, and a plurality of ports, including at least one write port. A given write port comprises at least one drive control circuit having an output coupled to respective gate terminals of both a write assist transistor and a drive transistor, with the write assist transistor being arranged in series with one of a pull-up and a pull-down path of a corresponding one of the inverters, and the drive transistor being configured to hold one of the internal nodes at a designated logic level in conjunction with a write operation. First and second drive control circuits of this type may generate complementary control signals for application to respective pairs of write assist and drive transistors associated with respective ones of the inverters.

20 Claims, 7 Drawing Sheets

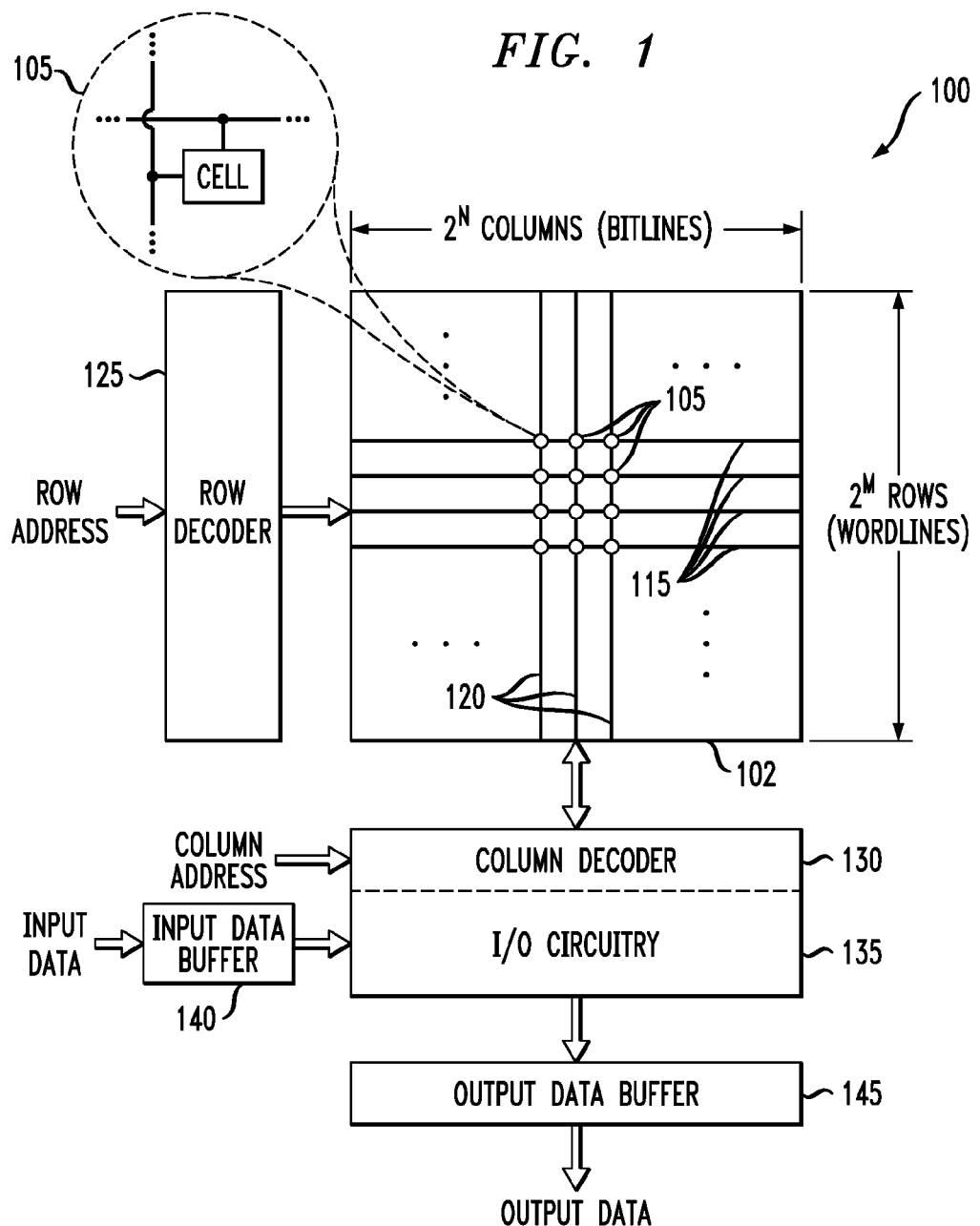

MEMORY DEVICE HAVING MULTI-PORT MEMORY CELL WITH EXPANDABLE PORT CONFIGURATION

BACKGROUND

A semiconductor memory device typically includes an array of memory cells arranged in rows and columns, with each memory cell configured to store a data bit. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into a precharge phase and an active phase, with the precharge phase being used to precharge the bitlines to a precharge voltage, and the active phase being used to read or write one or more memory cells of the array. Reading a given memory cell generally comprises transferring data stored within that cell to its corresponding bitline, and writing a given memory cell generally comprises transferring data into that cell from its corresponding bitline.

As transistor dimensions continue to shrink, it is becoming increasingly difficult to prevent local mismatch between the memory cell transistors of the memory device. This can adversely impact memory device performance, such as the ability to consistently write data to the memory cells at low voltages. For example, a conventional six-transistor (6T) static random access memory (SRAM) memory cell includes two NMOS pass gate transistors and a pair of cross-coupled inverters, with the two inverters collectively comprising two PMOS pull-up transistors and two NMOS pull-down transistors. In writing data to a conventional SRAM memory cell of this type, the bitline is discharged to a logic low level and the wordline is set to a logic high level. If in a given memory cell, worst case local variations cause the threshold voltage in the NMOS pass gate transistors to increase and the threshold voltage in the PMOS pull-up transistors to decrease, then the NMOS pass gate transistor coupled to the bitline may not be able to drive the corresponding inverter input below its trip point, and the memory cell will not be written with the data. For a memory cell with worst case local variations, at lower write voltages the overdrive of the NMOS pass gate transistor decreases, since the overdrive is given by VGS-VT, where VGS denotes the gate-to-source voltage and VT denotes the threshold voltage. Similarly, at lower write voltages the overdrive of the PMOS pull-up transistor increases, since the overdrive is given by VSG-VT, where VSG denotes the source-to-gate voltage. This reduced overdrive of the NMOS pass-gate transistor may reduce its drive current below the required source current of the PMOS pull-up transistor, leading to the above-noted write failures under worst case local variations.

A conventional approach for addressing the above-described problem is to use a boost signal to provide an additional negative voltage to the bitline during the write operation. Thus, when writing to the memory cell, the bitline is discharged to the negative supply voltage VSS, and then the boost signal is enabled to further reduce the bitline voltage below VSS. This approach, which is also referred to as "negative bootstrapping," increases the NMOS pass gate drive such that the inverter input is driven below its trip point, thereby allowing the data to be written to the memory cell under the above-noted worst case condition. An approach of this type is described in U.S. Patent Application Publication No. 2007/0109878, entitled "Memory Device with Improved Writing Capabilities."

However, the negative bootstrapping approach has a number of significant drawbacks. For example, in this approach the bitline negative voltage must be accurately adjusted above the local threshold voltage variation of the NMOS pass gate to ensure smooth write operations, which is very difficult to do in practice, particularly given the presence of variable bitline capacitances across the wide range of rows in a typical embedded memory array. In addition, one must ensure that the additional negative voltage does not cause the bitline junction to become forward biased. This could cause the memory cells in unaccessed rows to turn on at very low voltage, potentially leading to inadvertent overwriting of the data stored in those memory cells.

A possible alternative approach is to utilize a charge pump to provide a separately-controlled VDD supply voltage to the core portion of the memory cell, where the core portion comprises the four inverter transistors in the 6T SRAM cell. During a write operation when the bitline is discharged to a logic low level, the core VDD voltage is reduced below the VDD voltage used for the pass gate transistors. This reduces the required drive current of the PMOS pull-up transistors, ensuring that the NMOS pass gate is able to drive the inverter input below its trip point, thereby allowing the data to be written to the memory cell under the above-noted worst case condition. However, this approach requires accurate charge pump circuitry as well as variable pumping capacitance over the wide range of rows of the memory array, and is therefore increasingly difficult to implement as device dimensions shrink.

Improved techniques for addressing one or more of the issues identified above are disclosed in U.S. patent application Ser. No. 12/974,441, filed Dec. 21, 2010 and entitled "Memory Device having Memory Cells with Enhanced Low Voltage Write Capability," and U.S. patent application Ser. No. 13/031,798, filed Feb. 22, 2011 and entitled "Memory Device having Memory Cells with Write Assist Functionality," which are commonly assigned herewith and incorporated by reference herein. For example, embodiments disclosed in the latter application include memory cells in which application of power to respective supply nodes of two cross-coupled inverters of a given memory cell is separately controlled. Such an arrangement allows accurate low voltage write performance to be achieved without the need for negative bootstrapping or charge pumps.

However, additional issues remain to be addressed in SRAM design. For example, it is becoming increasingly difficult to meet write margin, signal-to-noise margin and stability requirements in multi-port SRAM memory cells. As a result, conventional designs may increase NMOS pass gate transistor size in order to meet these requirements. Also, NMOS pull-down transistor sizes may need to be increased. Thus, increasing the number of ports in an SRAM memory cell can unduly increase power consumption and circuit area, while also adversely impacting memory device cost and performance.

SUMMARY

Illustrative embodiments of the present invention provide memory devices having multi-port memory cells with an expandable port configuration that can accommodate multiple write ports without requiring significant increases in the sizes of the memory cell transistors. For example, one or more of these embodiments can accommodate up to 12 write ports in an arrangement with three-device stacks in the pull-up and pull-down paths of cross-coupled inverters of the memory cell, or up to 24 write ports in an arrangement with four-device stacks in the pull-up and pull-down paths, while also meeting requirements such as write margin, signal-to-noise margin and stability.

In one embodiment, a memory device includes a memory array comprising a plurality of memory cells. At least a given one of the memory cells comprises a pair of cross-coupled inverters, and a plurality of ports, including at least one write port. A given write port comprises at least one drive control circuit having an output coupled to respective gate terminals of both a write assist transistor and a drive transistor, with the write assist transistor being arranged in series with one of a pull-up and a pull-down path of a corresponding one of the inverters, and the drive transistor being configured to hold one of the internal nodes at a designated logic level in conjunction with a write operation.

The write assist transistor and the drive transistor are illustratively of opposite conductivity types, such that when a control signal at the output of the drive control circuit is at a first logic level, the write assist transistor is on and the drive transistor is off, and when the control signal at the output of the drive control circuit is at a second logic level, the write assist transistor is off and the drive transistor is on.

For each write port of the multi-port memory cell, first and second drive control circuits of the type described above may generate complementary control signals for application to respective pairs of write assist and drive transistors, the write assist and drive transistor pairs being associated with respective ones of the inverters.

One or more of the illustrative embodiments can provide a memory device comprising multi-port memory cells that do not require increased pass gate or pull-up transistor sizes in order to meet write margin, signal-to-noise margin and stability requirements. As a result, the number of ports in a given memory cell can be significantly increased without unduly increasing power consumption and circuit area, and without adversely impacting memory device cost and performance. Furthermore, manufacturing yield of memory device integrated circuits comprising such multi-port memory cells is also improved.

A memory device having multi-port memory cells in accordance with embodiments of the invention may be implemented, for example, as a stand-alone memory device, such as a packaged integrated circuit, or as an embedded memory in a microprocessor or other processing device. More particularly, the memory device having the multi-port memory cells may be implemented as an SRAM memory device or any other type of memory device, including a multi-port register file.

BRIEF DESCRIPTION OF THE DRAWINGS

FIG. 1 shows a semiconductor memory device comprising a memory array that incorporates multi-port memory cells in an illustrative embodiment of the invention.

DETAILED DESCRIPTION

Figure 2A:
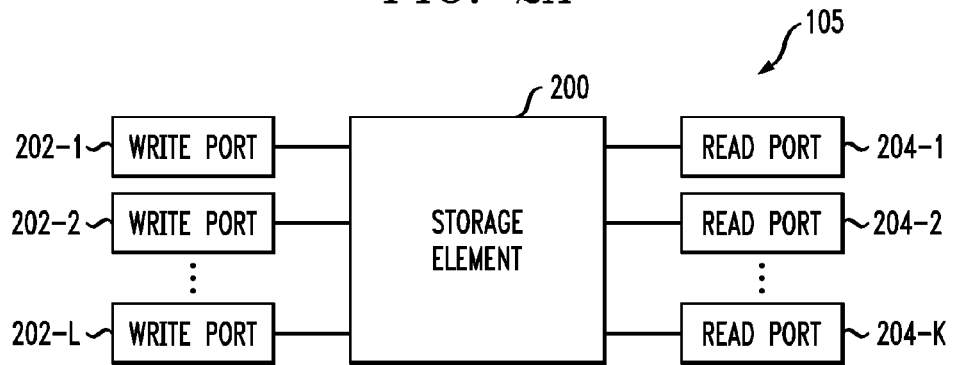
FIG. 2A is a block diagram of a multi-port memory cell that may be incorporated in the memory array of the semiconductor memory device of FIG. 1.

Embodiments of the invention will be illustrated herein in conjunction with exemplary semiconductor memory devices and multi-port memory cells. It should be understood, however, that embodiments of the invention are more generally applicable to any semiconductor memory device in which it is desirable to increase the number of memory cell ports without adversely impacting device performance. These and other embodiments may be implemented using circuitry other than that specifically shown and described in conjunction with the illustrative embodiments.

FIG. 1 shows a simplified diagram of a memory device 100 in accordance with an illustrative embodiment of the invention. The memory device 100 comprises a memory array 102. The memory array 102 comprises a plurality of memory cells 105 each configured to store a single bit of data. Each cell 105 is coupled to a corresponding row or wordline 115 and column or bitline 120. The memory array therefore includes a memory cell at each point where a wordline intersects with a bitline. The memory cells of the memory array are illustratively arranged in $2^N$ columns and $2^M$ rows. The values selected for N and M in a given implementation will generally depend upon on the data storage requirements of the application in which the memory device is utilized.

It is assumed without limitation that the memory cells 105 in the present embodiment are multi-port memory cells. More particularly, each memory cell 105 in this embodiment comprises multiple write ports and one or more read ports, as will be described below in conjunction with FIG. 2. The wordlines 115 and bitlines 120 in this embodiment therefore each comprise multiple distinct lines, associated with respective ones of the ports of a corresponding multi-port memory cell, although wordlines 115 and bitlines 120 are shown as respective single lines in FIG. 1 for simplicity and clarity of illustration.

Also, the bitlines 115 may each comprise a pair of differential lines, denoted for example as a bitline BL and its complement BLN, for each of the ports of a given memory cell 105. Separate pairs of differential bitlines may therefore be associated with each of the multiple ports of a given memory cell 105.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise sensing circuitry, such as sense amplifiers coupled to respective ones of the bitlines 120. The operation of memory device elements such as row decoder 125, column decoder 130, I/O circuitry 135, and buffers 140, 145 is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

The memory device 100 in one or more of the illustrative embodiments is assumed to comprise an SRAM device. However, as indicated previously, the disclosed multi-port memory cells 105 can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, one or more of the multi-port memory cells 105 in the memory array 102 could be multi-level cells each configured to store more than one bit of data. Embodiments of the invention are therefore not limited in terms of the particular storage or access mechanism utilized in the memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing embodiments of the invention.

The present embodiment of memory device 100 is configured to avoid one or more of the drawbacks of conventional practice through the use of multi-port memory cells with improved write port circuitry arrangements, examples of which will be described in conjunction with FIGS. 2 through 6.

Figure 3:
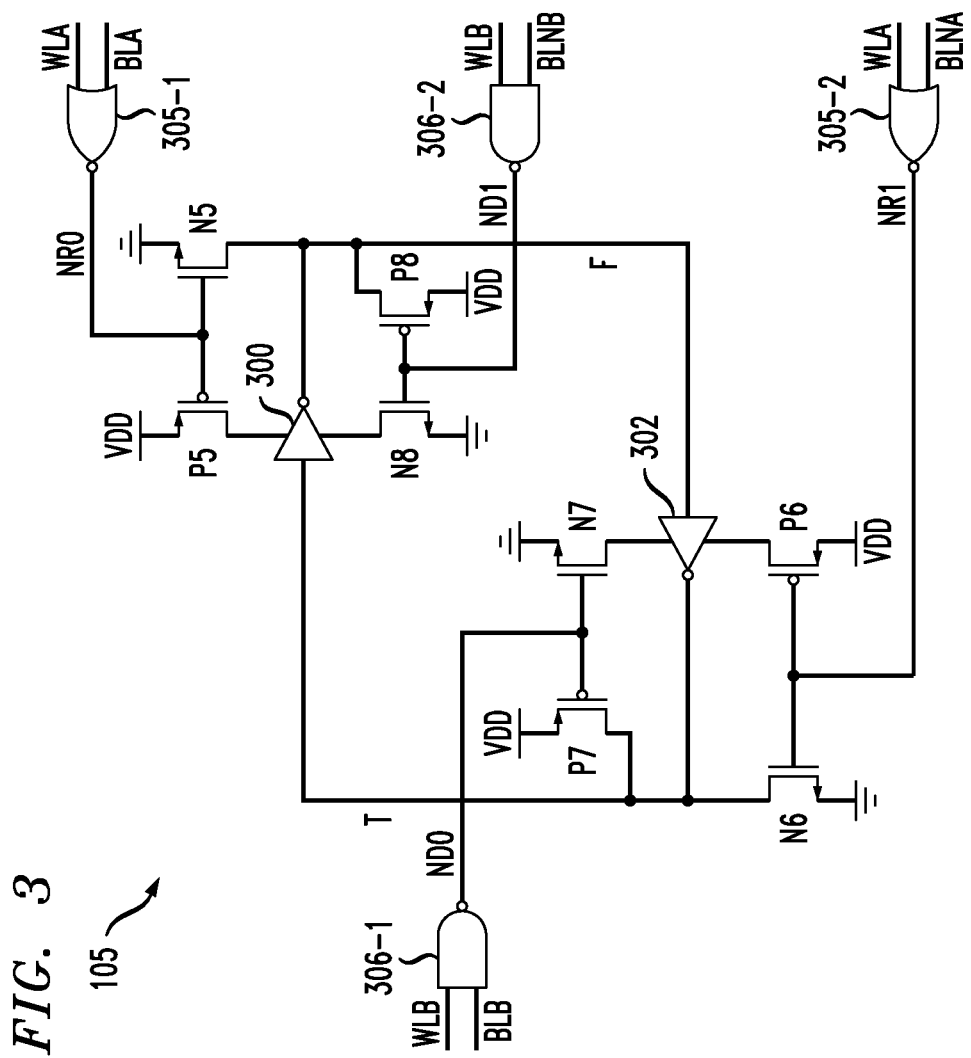
FIG. 3 is a schematic diagram of a multi-port memory cell with two write ports in an illustrative embodiment.
Figure 4:
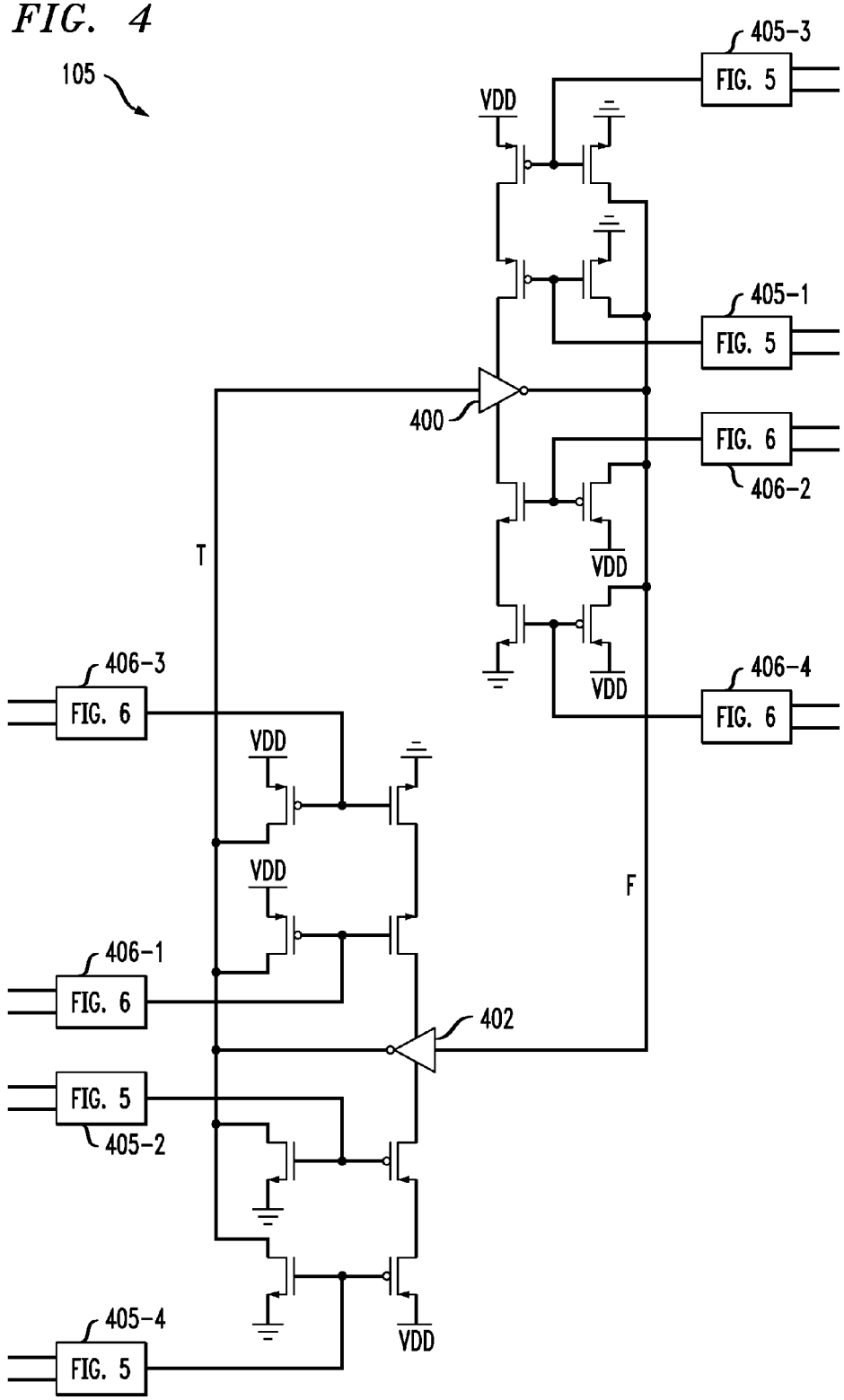
FIG. 4 is a schematic diagram of a multi-port memory cell with 12 write ports in an illustrative embodiment.

Referring now to FIG. 2A, a given one of the memory cells 105 comprises a storage element 200, write ports 202-1, 202-2, . . . 202-L, and read ports 204-1, 204-2, . . . 204-K. The number of write ports L may be greater than, less than or equal to the number of read ports K. Also, both L and K are greater than or equal to two in some embodiments of the invention, while in other embodiments, at least one of L and K is equal to one. Thus, a given embodiment may include, for example, a single write port and multiple read ports, or a single read port and multiple write ports. Numerous other configurations are possible. The storage element 200 generally comprises a pair of cross-coupled inverters, examples of which are shown in FIGS. 3 and 4.

Embodiments to be described in conjunction with FIGS. 3 through 6 below include memory cells with two write ports configured utilizing a two-device stack, 12 write ports configured utilizing a three-device stack, or 24 write ports configured utilizing a four-device stack. In these embodiments, L is equal to 2, 12 or 24, and K may be greater than or equal to one. More generally, L may be greater than or equal to one, and so in some embodiments can take on values including 1, 2, 3, 4, . . . 24 when the maximum device stack is four. In an embodiment with only a single write port, a single-device stack in either a pull-up or pull-down path may be used.

Figure 2B:
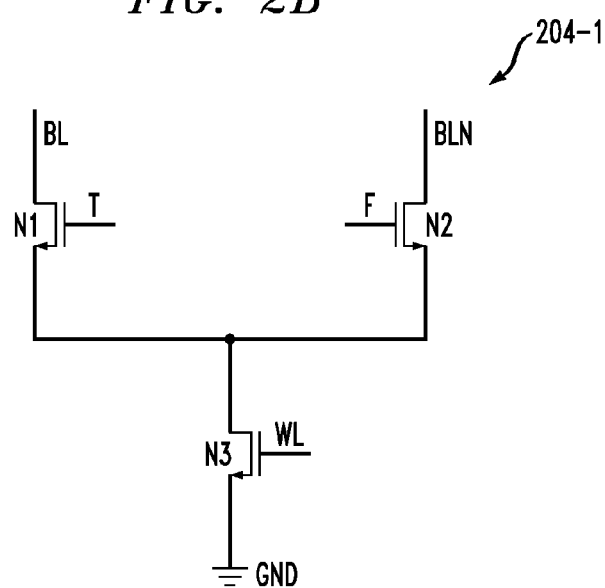
FIG. 2B is a schematic diagram of a read port of the memory cell of FIG. 2A.

FIG. 2B shows a given one of the read ports 204-1 in an illustrative embodiment. The read port comprises n-type metal-oxide-semiconductor (NMOS) transistors N1 and N2 with their gates coupled to respective internal nodes T and F of the storage element 200. The drains of N1 and N2 are coupled to a corresponding bitline BL and its complement BLN, respectively, and the sources of N1 and N2 are both coupled to the drain of NMOS transistor N3, which has its source coupled to ground potential and its gate coupled to a wordline WL. In the present embodiment, multiple such read ports may be added to the memory cell without introducing any stability issues or requiring any increase in transistor sizes. Other types of read port circuitry may be used in other embodiments.

Additional details regarding read port circuitry of the type shown in FIG. 2B may be found in U.S. patent application Ser. No. 12/958,402, filed Dec. 2, 2010 and entitled "Write Assist Static Random Access Memory Cell," which is incorporated by reference herein. Also disclosed in this application is write port circuitry that may be utilized in embodiments of the present invention.

The read port 104-1 of FIG. 2B may be coupled to the memory cell 105 shown in FIG. 3. This illustrative embodiment of the memory cell comprises a pair of cross-coupled inverters 300 and 302, inputs of which correspond to the respective internal nodes T and F. Also shown in FIG. 3 is write port circuitry of the memory cell.

In the FIG. 3 multi-port memory cell 105, the write port circuitry comprises first and second NOR gates 305-1 and 305-2, and first and second NAND gates 306-1 and 306-2. The first NOR gate 305-1 receives as its inputs a first writeline denoted WLA and a first bitline denoted BLA, and the second NOR gate 305-2 takes as its inputs the first wordline WLA and the complement of the first bitline BLA, which is denoted BLNA. The first NAND gate 306-1 receives as its inputs a second writeline denoted WLB and a second bitline denoted BLB, and the second NAND gate 306-2 takes as its inputs the second wordline WLB and the complement of the first bitline BLB, which is denoted BLNB. The NOR and NAND gates 305 and 306 of the FIG. 3 embodiment are examples of what are more generally referred to herein as "drive control circuits."

The outputs of the NOR gates 305-1 and 305-2 are denoted NR0 and NR1, respectively, and the outputs of the NAND gates 306-1 and 306-2 are denoted ND0 and ND1, respectively. The NR0, NR1, ND0 and ND1 outputs of gates 305 and 306 drive connected gate terminals of transistor pairs P5-N5, P6-N6, P7-N7 and P8-N8, respectively.

PMOS transistors P5 and P6 are in the pull-up paths of inverters 300 and 302, respectively, while NMOS transistors N7 and N8 are in the pull-down paths of inverters 300 and 302, respectively. These transistors are examples of what are more generally referred to herein as "write assist transistors."

In this embodiment, an additional PMOS transistor P5 or P6 is added in the pull-up path of each inverter 300 and 302 to its upper supply voltage, illustratively VDD, and an additional NMOS transistor N7 or N8 is added in the pull-down path of each inverter 300 and 302 to its lower supply voltage, illustratively ground potential. The resulting arrangement is also referred to herein as a two-device pull-up or pull-down stack. This is because a given pull-up path includes the internal PMOS pull-up transistor of the inverter 300 or 302 as well as the additional pull-up transistor P5 or P6 for write assist, and thus comprises a stack of two pull-up devices.

Similarly, a given pull-down path includes the internal NMOS pull-down transistor of the inverter 300 or 302 as well as the additional pull-down transistor N7 or N8 for write assist, and thus comprises a stack of two pull-down devices.

As indicated previously, such a two-device pull-up and pull-down stack arrangement as illustrated in FIG. 3 accommodates two write ports, one corresponding to writeline WLA and bitline BLA and the other corresponding to writeline WLB and bitline BLB. Another embodiment with a three-device pull-up and pull-down stack arrangement accommodating 12 write ports will be described in conjunction with FIG. 4.

PMOS transistors P7 and P8 and NMOS transistors N5 and N6 are configured to selectively hold outputs of their corresponding inverters 300 and 302 at respective high and low logic levels, in order to write data to the memory cell via the corresponding write ports, responsive to the NR0, NR1, ND0 and ND1 outputs of gates 305 and 306. The transistors P7, P8, N5 and N6 are examples of what are more generally referred to herein as "drive transistors."

Accordingly, in the FIG. 3 embodiment, a given write port of the memory cell 105 comprises first and second drive control circuits configured to generate complementary control signals for application to respective pairs of write assist and drive transistors associated with respective ones of the inverters 300 and 302.

In order to write a logic "1" bit to the memory cell via the write port comprising gates 305-1 and 305-2, WLA and BLA are driven low, which forces NR0 high via gate 305-1, turning off P5 to disconnect the pull-up path of inverter 300 and turning on N5 to force internal node F low. Driving WLA and BLA low also forces NR1 low via gate 305-2, which turns off N6 and turns on P6.

Similarly, to write a logic "1" bit to the memory cell via the write port comprising gates 306-1 and 306-2, WLB and BLB are driven high, which forces ND0 low via gate 306-1, turning off N7 to disconnect the pull-down path of inverter 302 and turning on P7 to force internal node T high. Driving WLB and BLB high also forces ND1 high via gate 306-2, which turns off P8 and turns on N8.

Operations for writing logic "0" bits to the memory cell 105 via the two write ports are performed in a manner analogous to that described above.

Referring now to FIG. 4, another embodiment of multi-port memory cell 105 includes three-device stacks of PMOS transistors in the respective pull-up paths of cross-coupled inverters 400 and 402, and three-device stacks of NMOS transistors in the respective pull-down paths of cross-coupled inverters 400 and 402. Complex gates denoted 405-1, 405-2, 405-3 and 405-4 drive the connected gate terminals of respective pairs of NMOS and PMOS transistors as shown. These complex gates 405 are shown in greater detail in FIG. 5, and replace the NOR gates 305 described in conjunction with the FIG. 3 embodiment. Similarly, complex gates denoted 406-1, 406-2, 406-3 and 406-4 drive the connected gate terminals of respective additional pairs of NMOS and PMOS transistors as shown. These complex gates 406 are shown in greater detail in FIG. 6, and replace the NAND gates 306 described in conjunction with the FIG. 3 embodiment.

By replacing the NOR and NAND gates of FIG. 3 with the complex gates 405 and 406, respectively, and increasing the number of devices in the pull-up and pull-down stacks of the inverters 400 and 402 accordingly, the multi-port memory cell 105 of FIG. 4 is able to accommodate 12 write ports. The operation of the memory cell in writing data via these ports is otherwise similar to that previously described in conjunction with FIG. 3.

It should also be noted that if the NOR and NAND gates of FIG. 3 were directly replaced with the corresponding complex gates 405 and 406, respectively, but without any increase in the number of devices in the pull-up and pull-down stacks, the resulting memory cell would accommodate 6 write ports.

Figure 5:
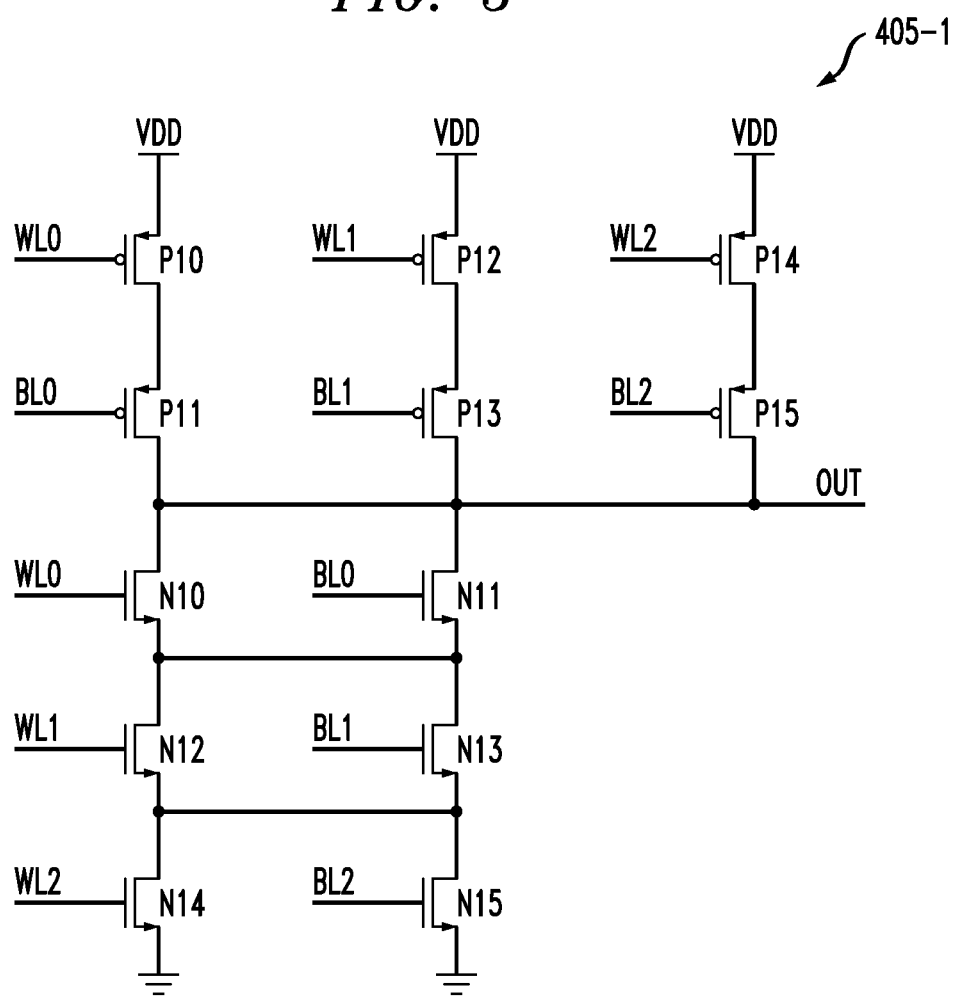
FIGS. 5 and 6 show more detailed views of write port circuitry in the multi-port memory cell of FIG. 4.

As shown in FIG. 5, a given one of the complex gates 405-1 comprises six PMOS transistors P10-P15 and six NMOS transistors N10-N15, each receiving at its gate one of three wordline inputs WL0, WL1 and WL2 or one of three bitline inputs BL0, BL1 and BL2. The wordline-bitline pairs WL0-BL0, WL1-BL1 and WL2-BL2 correspond to the respective write ports supported by the complex gate 405-1. By way of example, the first write port corresponding to WL0-BL0 includes PMOS transistors P10 and P11 coupled to WL0 and BL0, respectively, and NMOS transistors N10 and N11 coupled to WL0 and BL0, respectively. The other write ports are configured in a similar manner. The output OUT of the complex gate 405-1 is coupled to the respective drain terminals of P11, P13, P15, N10 and N11.

Figure 6:
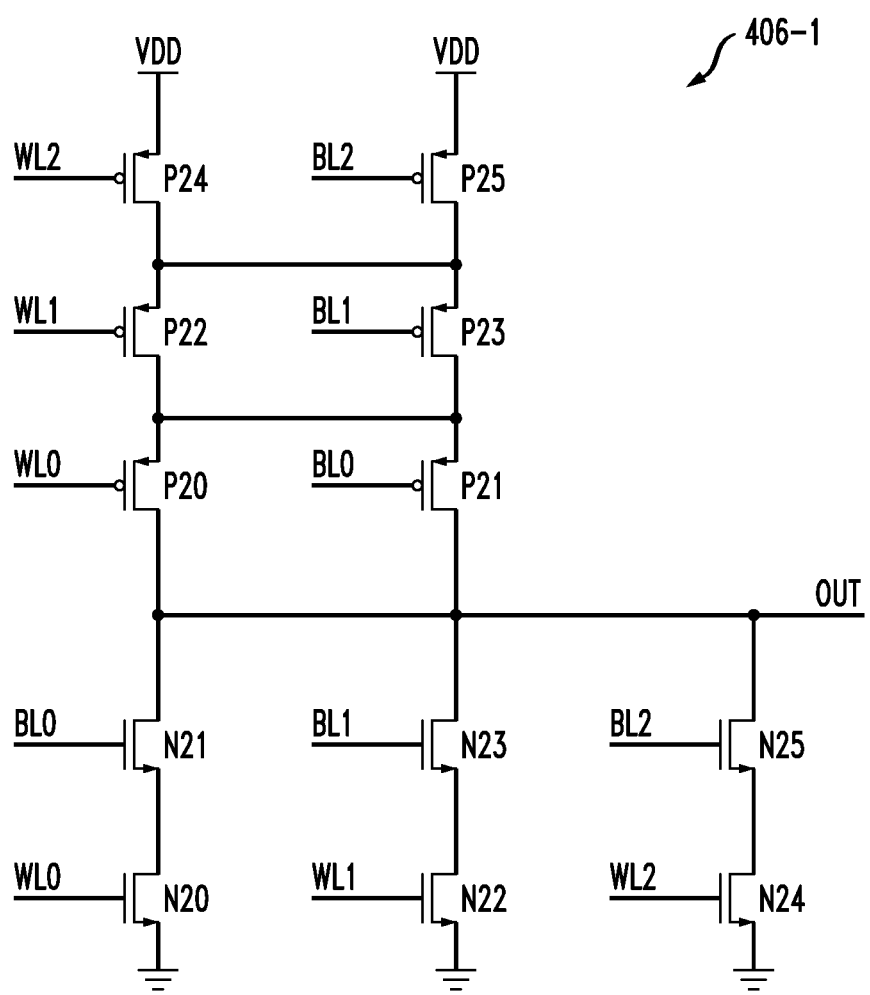

Similarly, as illustrated in FIG. 6, a given one of the complex gates 406-1 comprises six PMOS transistors P20-P25 and six NMOS transistors N20-N25, each receiving at its gate one of three wordline inputs WL0, WL1 and WL2 or one of three bitline inputs BL0, BL1 and BL2. The wordline-bitline pairs WL0-BL0, WL1-BL1 and WL2-BL2 correspond to the respective write ports supported by the complex gate 406-1. By way of example, the first write port corresponding to WL0-BL0 includes PMOS transistors P20 and P21 coupled to WL0 and BL0, respectively, and NMOS transistors N20 and N21 coupled to WL0 and BL0, respectively. The other write ports are configured in a similar manner. The output OUT of the complex gate 406-1 is coupled to the respective drain terminals of P20, P21, N21, N23 and N25.

The complex gates illustrated in FIGS. 5 and 6 are also considered examples of "drive control circuits" as that term is broadly utilized herein. A given write port in these embodiments generally comprises first and second drive control circuits configured to generate complementary control signals for application to respective pairs of write assist and drive transistors associated with respective cross-coupled inverters of the corresponding memory cell.

The PMOS and NMOS transistors in FIGS. 5 and 6 are assumed to have widths and lengths of 0.1 and 0.03 micrometers, respectively, although other dimensions could be used.

The FIG. 4 multi-port memory cell can be expanded to accommodate 24 write ports by increasing the number of devices in the pull-up and pull-down stacks to four, and replicating additional complex gates 405 and 406 accordingly. Numerous other alternative arrangements of complex gates and device stacks are possible.

It is therefore apparent that, in embodiments of the present invention, the number of number of write ports and read ports implemented in a given multi-port memory cell can be easily adjusted within a given memory design, for example, in response to particular customer requirements.

The multi-port memory cells 105 as described in conjunction with FIGS. 2 through 6 above provide a number of other advantages relative to conventional arrangements. For example, one or more of these embodiments provide multi-port memory cells that do not require increased pass gate or pull-up transistor sizes in order to meet write margin, signal-to-noise margin and stability requirements, and use of smaller transistors in the memory cell provides a significant reduction in a leakage current. These memory cells also exhibit an enhanced low voltage write capability that does not require negative bootstrapping or charge pumps. In addition, this low voltage write capability is provided without adversely impacting high voltage write operations or read operations.

As a result, the number of ports in a given multi-port memory cell can be significantly increased using the techniques disclosed herein, without unduly increasing power consumption and circuit area, and without adversely impacting memory device cost and performance. Furthermore, manufacturing yield of memory device integrated circuits comprising such multi-port memory cells is also improved.

It is to be appreciated that the particular multi-port memory cell circuitry shown in the embodiments of FIGS. 2 through 6 is presented by way of illustration only, and a wide variety of other types of memory cell circuitry may be utilized in other embodiments of the present invention. For example, in one or more of these other embodiments, the conductivity types of certain PMOS and NMOS transistors of the memory cell circuitry may be reversed, and other suitable modifications may be made to the circuitry and associated signaling levels, as would be appreciated by one skilled in the art.

Embodiments of the multi-port memory cell 105 can be implemented in a wide variety of different memory applications. For example, such multi-port memory cells are particularly well suited for use in high-speed SRAMs and DRAMs, as well as in other types of memories that require multiple read or write ports, such as content-addressable memories (CAMs) and processor register files.

A given memory device configured in accordance with an embodiment of the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 7:
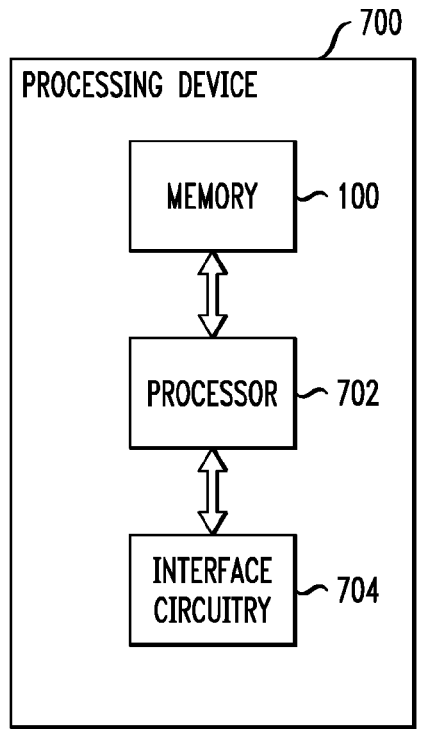
FIG. 7 is a block diagram of a processing device which incorporates the memory device of FIG. 1.

FIG. 7 shows an embodiment of a processing device 700 which incorporates the memory device 100 of FIG. 1. In this embodiment, the memory device 100 is coupled to a processor 702. The processing device further includes interface circuitry 704 coupled to the processor 702. The processing device 700 may comprise, for example, a computer, a server or a portable communication device such as a mobile telephone. The interface circuitry 704 may comprise one or more transceivers for allowing the device 700 to communicate over a network.

Figure 8:
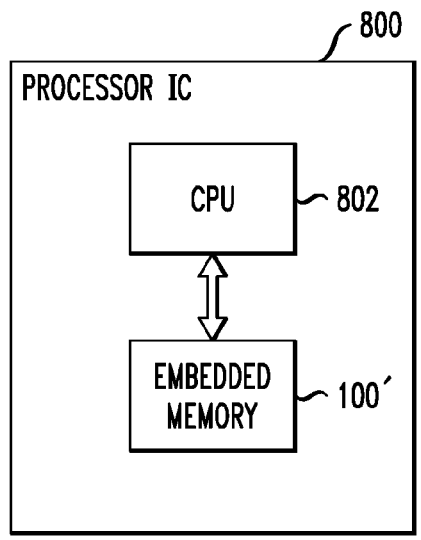
FIG. 8 is a block diagram of a processor integrated circuit which incorporates the memory device of FIG. 1 as an embedded memory.

Alternatively, processing device 700 may comprise a microprocessor, DSP or ASIC, with processor 702 corresponding to a central processing unit (CPU) and memory device 100 providing at least a portion of an embedded memory of the microprocessor, DSP or ASIC. FIG. 8 shows an example of an arrangement of this type, with processor integrated circuit 800 incorporating the memory device of FIG. 1 as an embedded memory 100'. The embedded memory 100' in this embodiment is coupled to a CPU 802. The embedded memory may comprise, for example, a high-speed register file. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with multi-port memory cells as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, memory cell circuitry, storage elements, pull-up and pull-down stacks, write port circuitry, drive control circuits, transistor conductivity types, control signals, and other elements for implementing the described functionality. These and numerous other alternative embodiments within the scope of the following claims will be apparent to those skilled in the art.

What is claimed is:

1. A memory device comprising:
   a memory array comprising a plurality of memory cells;
   at least a given one of the memory cells comprising:
      a pair of cross-coupled inverters, with an output of each inverter being coupled to an input of the other inverter at a corresponding internal node of the memory cell; and
      a plurality of ports, including at least one write port;
   wherein a given write port comprises:
      at least one drive control circuit having an output coupled to respective gate terminals of both a write assist transistor and a drive transistor, the write assist transistor being arranged in series with one of a pull-up and a pull-down path of a corresponding one of the inverters, the drive transistor being configured to hold one of the internal nodes at a designated logic level in conjunction with a write operation.

2. The memory device of claim 1 wherein the write assist transistor and the drive transistor are of opposite conductivity types, such that when a control signal at the output of the drive control circuit is at a first logic level the write assist transistor is on and the drive transistor is off, and when the control signal at the output of the drive control circuit is at a second logic level the write assist transistor is off and the drive transistor is on.

3. The memory device of claim 1 wherein the write assist transistor in combination with an internal pull-up or pull-down transistor of the corresponding one of the inverters forms a two-device pull-up or pull-down stack within the memory cell.

4. The memory device of claim 1 wherein the given write port comprises:
   a first drive control circuit having an output coupled to respective gate terminals of both a first write assist transistor and a first drive transistor, the first write assist transistor and the first drive transistor being of opposite conductivity types, the first write assist transistor being arranged in series with a pull-up path of a first one of the inverters, the first drive transistor being configured to hold a first one of the internal nodes at a logic low level in conjunction with a write operation; and
   a second drive control circuit having an output coupled to respective gate terminals of both a second write assist transistor and a second drive transistor, the second write assist transistor and the second drive transistor being of opposite conductivity types, the second write assist transistor being arranged in series with a pull-up path of a second one of the inverters, the second drive transistor being configured to hold a second one of the internal nodes at the logic low level in conjunction with the write operation;
   wherein control signals at the respective outputs of the first and second drive control circuits are complementary to one another.

5. The memory device of claim 4 wherein the first and second drive control circuits comprise respective two-input NOR gates.

6. The memory device of claim 5 wherein a first one of the NOR gates receives at its inputs corresponding respective wordline and bitline signals of the given write port, and the second one of the NOR gates receives at its inputs the wordline signal and a complemented bitline signal of the given write port.

7. The memory device of claim 4 wherein the first and second drive control circuits comprise respective first and second complex logic gates, each of the complex logic gates receiving multiple wordline signal inputs and multiple bitline signal inputs.

8. The memory device of claim 1 wherein the given write port comprises:
a first drive control circuit having an output coupled to respective gate terminals of both a first write assist transistor and a first drive transistor, the first write assist transistor and the first drive transistor being of opposite conductivity types, the first write assist transistor being arranged in series with a pull-down path of a first one of the inverters, the first drive transistor being configured to hold a first one of the internal nodes at a logic high level in conjunction with a write operation; and
a second drive control circuit having an output coupled to respective gate terminals of both a second write assist transistor and a second drive transistor, the second write assist transistor and the second drive transistor being of opposite conductivity types, the second write assist transistor being arranged in series with a pull-down path of a second one of the inverters, the second drive transistor being configured to hold a second one of the internal nodes at the logic high level in conjunction with the write operation;
wherein control signals at the respective outputs of the first and second drive control circuits are complementary to one another.

9. The memory device of claim 8 wherein the first and second drive control circuits comprise respective two-input NAND gates.

10. The memory device of claim 9 wherein a first one of the NAND gates receives at its inputs corresponding respective wordline and bitline signals of the given write port, and the second one of the NAND gates receives at its inputs the wordline signal and a complemented bitline signal of the given write port.

11. The memory device of claim 8 wherein the first and second drive control circuits comprise respective first and second complex logic gates, each of the complex logic gates receiving multiple wordline signal inputs and multiple bitline signal inputs.

12. The memory device of claim 1 wherein the plurality of ports comprises L write ports and K read ports, where both L and K are greater than or equal to one.

13. The memory device of claim 1 wherein the plurality of ports comprises one of the following configurations:
a first configuration comprising two write ports configured utilizing two-device pull-up and pull-down stacks for each of the cross-coupled inverters, with each of the stacks comprising a combination of a write assist transistor and an internal pull-up or pull-down transistor of a corresponding one of the inverters;
a second configuration comprising 12 write ports configured utilizing three-device pull-up and pull-down stacks for each of the cross-coupled inverters; and
a third configuration comprising 24 write ports configured utilizing four-device pull-up and pull-down stacks for each of the cross-coupled inverters.

14. The memory device of claim 1 wherein the given write port comprises first and second drive control circuits configured to generate complementary control signals for application to respective pairs of write assist and drive transistors associated with respective ones of the inverters.

15. An integrated circuit comprising the memory device of claim 1.

16. A processing device comprising the memory device of claim 1.

17. A method comprising:
providing a memory cell comprising:
a pair of cross-coupled inverters, with an output of each inverter being coupled to an input of the other inverter at a corresponding internal node of the memory cell; and
a plurality of ports, including at least one write port; and
during a write operation of the memory cell:
applying a control signal from a given write port to respective gate terminals of both a write assist transistor and a drive transistor, the write assist transistor being arranged in series with one of a pull-up and a pull-down path of a corresponding one of the inverters, the drive transistor being configured to hold a corresponding one of the internal nodes of the memory cell at a designated logic level in conjunction with the write operation.

18. The method of claim 17 wherein the write assist transistor and the drive transistor are of opposite conductivity types, such that when the control signal is at a first logic level the write assist transistor is on and the drive transistor is off, and when the control signal is at a second logic level the write assist transistor is off and the drive transistor is on.

19. The method of claim 17 wherein the applying step comprises applying complementary control signals to respective pairs of write assist and drive transistors associated with respective ones of the inverters.

20. A memory cell comprising:
a pair of cross-coupled inverters, with an output of each inverter being coupled to an input of the other inverter at a corresponding internal node of the memory cell; and
a plurality of ports, including at least one write port;
wherein a given write port comprises at least one drive control circuit having an output coupled to respective gate terminals of both a write assist transistor and a drive transistor, the write assist transistor being arranged in series with one of a pull-up and a pull-down path of a corresponding one of the inverters, the drive transistor being configured to hold one of the internal nodes at a designated logic level in conjunction with a write operation.

* * * * *